United States Patent
Takano et al.

(10) Patent No.: US 6,891,742 B2
(45) Date of Patent: May 10, 2005

(54) SEMICONDUCTOR MEMORY DEVICE

(75) Inventors: Yoh Takano, Gifu (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/480,247

(22) PCT Filed: Jul. 12, 2002

(86) PCT No.: PCT/JP02/07094

§ 371 (c)(1),
(2), (4) Date: Dec. 15, 2003

(87) PCT Pub. No.: WO03/009302

PCT Pub. Date: Jan. 30, 2003

(65) Prior Publication Data

US 2004/0174728 A1 Sep. 9, 2004

(30) Foreign Application Priority Data

Jul. 17, 2001 (JP) ........................................ 2001-216084

(51) Int. Cl.$^7$ .............................................. G11C 11/22
(52) U.S. Cl. ........................ 365/145; 365/174; 365/173
(58) Field of Search ................................. 365/145, 173, 365/174, 171; 711/162

(56) References Cited

U.S. PATENT DOCUMENTS

| | | | | |
|---|---|---|---|---|
| 5,666,305 A | | 9/1997 | Mihara et al. ............... | 365/145 |
| 5,963,466 A | * | 10/1999 | Evans, Jr. .................... | 365/145 |
| 6,114,861 A | | 9/2000 | Takeo ........................... | 324/658 |
| 6,157,563 A | | 12/2000 | Hirano et al. ................ | 365/145 |
| 6,336,174 B1 | * | 1/2002 | Li et al. ....................... | 711/162 |
| 6,370,056 B1 | * | 4/2002 | Chen et al. .................. | 365/145 |

FOREIGN PATENT DOCUMENTS

| | | |
|---|---|---|
| JP | 02-154389 | 6/1990 |
| JP | 09-091970 | 4/1997 |
| JP | 09-265784 | 10/1997 |
| JP | 10-112191 | 4/1998 |
| JP | 11-086534 | 3/1999 |
| JP | 2000-235794 | 8/2000 |
| JP | 2000-269444 | 9/2000 |
| JP | 2001-167584 | 6/2001 |

* cited by examiner

*Primary Examiner*—Van Thu Nguyen
*Assistant Examiner*—Pho M. Luu
(74) *Attorney, Agent, or Firm*—Arent Fox, PLLC.

(57) ABSTRACT

A semiconductor memory device having a first memory including a bit line, a word line arranged to intersect with the bit line and a storage unit arranged between the bit line and the word line, and a second memory different in type from the first memory. The first memory and the second memory are formed on a semiconductor substrate in a stacked manner reducing the thickness in the height direction and attaining further miniaturization (thinning). Further, no wire having a large parasitic capacitance or solder is employed for connecting the first memory and the second memory, thereby enabling high-speed data transfer between the first memory and the second memory.

22 Claims, 15 Drawing Sheets

SEMICONDUCTOR MEMORY DEVICE

TECHNICAL FIELD

The present invention relates to a semiconductor memory device, and more specifically, it relates to a semiconductor memory device including different types of memories.

BACKGROUND TECHNIQUE

In general, a portable device adopting computer architecture employs an SRAM (Static Random Access Memory) exhibiting a high speed as a main storage part while a highly integrated nonvolatile flash memory is used as an auxiliary storage part. FIG. 21 is a block diagram showing the structure of a memory system in a conventional portable device having such a structure. In the prior art shown in FIG. 21, an SRAM 102 is employed as a main storage part storing data of a CPU (central processing unit) 103. A flash memory 101 is employed as an auxiliary storage part.

In the case of the conventional structure shown in FIG. 21, two chips of the flash memory 101 and the SRAM 102 are generally required, and hence this is disadvantageous to miniaturization of the device. This structure is also disadvantageous in speed since a delay is caused by wires between the chips.

In order to solve such inconvenience, a product prepared by pasting a chip of a flash memory 101 and a chip of an SRAM 102 together and storing the same in a single package has also been developed in recent years. FIG. 22 is a perspective view showing the structure of such a conventionally developed semiconductor package. In this semiconductor package, it is possible to deal with a certain degree of miniaturization by superposing the chip of the flash memory 101 and the chip of the SRAM 102 vertically, as shown in FIG. 22.

In the product shown in FIG. 22 prepared by superposing the chip of the flash memory 101 and the chip of the SRAM 102 vertically and storing the same in the single package, however, it has been difficult to reduce the thickness in the height direction due to the superposition of the two chips. Thus, there has been such a problem that it is difficult to attain further miniaturization (thinning).

Further, the chip of the flash memory 101 and the chip of the SRAM 102 are wired with wires 104 by solder or the like, and hence parasitic capacitances increase. Thus, there has also been such a problem that power consumption enlarges to inhibit speed-up.

With respect to requirement for reduction of the power supply voltage for the portable device, there has been such inconvenience that a high voltage is required for writing in memory cells of the flash memory 101. There has also been such inconvenience that the area and power consumption of a step-up circuit 101a for generating a high voltage enlarge. Therefore, it has been difficult to attain reduction of the power supply voltage and reduction of power consumption of the portable device.

A ferroelectric memory is known as one of recently remarked nonvolatile memories. This ferroelectric memory is a memory utilizing capacitance change responsive to the direction of polarization of a ferroelectric substance as a memory element. This ferroelectric memory, capable of data writing at a high speed and a low voltage in principle, is remarked as a nonvolatile memory of the next generation.

Among memory cell systems for the ferroelectric memory, a two-transistor two-capacitor system and a one-transistor one-capacitor system are lower in degree of integration as compared with the flash memory, and hence insufficient as substitutions for the flash memory. On the other hand, a simple matrix ferroelectric memory has a simple structure of merely arranging ferroelectric capacitors on the intersections between word lines and bit lines can be highly integrated. Therefore, the simple matrix ferroelectric memory is remarked as a substitutable memory for the flash memory.

However, the simple matrix ferroelectric memory has a problem of such disturbance that data in non-selected cells disappear. In other words, it follows that a voltage of ½Vcc is applied to non-selected memory cells connected to a selected bit line and a selected word line in writing and reading. Therefore, there is such a problem that the quantity of polarization gradually decreases due to hysteretic properties of the ferroelectric substance and the data disappear as a result.

DISCLOSURE OF THE INVENTION

An object of the present invention is to provide a semiconductor memory device capable of attaining further miniaturization (thinning) and speed-up in the case of including different types of memories.

Another object of the present invention is to prevent disturbance in the aforementioned semiconductor memory device.

Still another object of the present invention is to attain reduction of a voltage and reduction of power consumption in the aforementioned semiconductor memory device.

A semiconductor memory device according to a first aspect of the present invention comprises a first memory including a bit line, a word line arranged to intersect with the bit line and storage means arranged between the bit line and the word line and a second memory different in type from the first memory. The first memory and the second memory are formed on a semiconductor substrate.

In this semiconductor memory device according to the first aspect, as hereinabove described, the first memory and the second memory are so formed on the semiconductor substrate that it is possible to reduce the thickness in the height direction when forming the first memory and the second memory on the identical semiconductor substrate in a stacked manner, for example, whereby further miniaturization (thinning) can be attained. When forming the first memory and the second memory on the semiconductor substrate in a stacked manner, further, no wire having a large parasitic capacitance or solder may be employed for connection of the first memory and the second memory but the memories can be closely arranged, whereby high-speed data transfer is enabled between the first memory and the second memory.

In the aforementioned semiconductor memory according to the first aspect, the first memory and the second memory are preferably formed on the identical semiconductor substrate in a stacked manner.

In the aforementioned semiconductor memory device according to the first aspect, at least either the word line or the bit line is preferably shared by the first memory and the second memory. According to this structure, the number of the bit line and the word line can be reduced, whereby the structure can be simplified.

In the aforementioned semiconductor memory device according to the first aspect, the first memory preferably includes a plurality of memory cell arrays each including a plurality of memory cells, the bit line preferably includes a main bit line and an auxiliary bit line connected to the main bit line and arranged every memory cell array, the word line preferably includes a main word line and an auxiliary word line connected to the main word line and arranged every memory cell array, and the memory cells of the first memory are preferably connected to the auxiliary word line and the auxiliary bit line. Thus, the bit lines and the word lines are so brought into a hierarchical structure that wires connected to the memory cells shorten, whereby wiring capacitances decrease. Thus, high-speed reading can be performed.

In this case, the first memory preferably includes a ferroelectric memory, and the memory cells of the ferroelectric memory preferably include the auxiliary bit line, the auxiliary word line and a ferroelectric layer serving as the storage means arranged between the auxiliary bit line and the auxiliary word line. According to this structure, a first memory consisting of a simple matrix ferroelectric memory can be easily implemented. In this case, the second memory preferably includes a static memory, and the main bit line is preferably shared by the ferroelectric memory constituting the first memory and the static memory constituting the second memory. According to this structure, the structure can be simplified as compared with a case of separately providing main bit lines respectively.

In the aforementioned structure having the bit lines and the word lines of the hierarchical structure, the main bit line and the auxiliary bit line are preferably formed on the identical semiconductor substrate in a stacked manner, and the main word line and the auxiliary word line are preferably formed on the identical semiconductor substrate in a stacked manner. According to this structure, the hierarchical structure of the bit lines and the word lines can be easily formed. In this case, the main bit line and the main word line may be formed above the auxiliary bit line and the auxiliary word line.

In the aforementioned structure having the bit lines and the word lines of the hierarchical structure, the semiconductor memory device preferably further comprises a first selector transistor connected between the auxiliary bit line and the main bit line and a second selector transistor connected between the auxiliary word line and the main word line. According to this structure, a prescribed auxiliary word line and a prescribed auxiliary bit line can be selected through the first selector transistor and the second selector transistor, whereby a prescribed memory cell of the first memory can be easily selected for performing data writing and reading. In this case, the semiconductor memory device preferably further comprises a first selection line connected to the gate of the first selector transistor and a second selection line connected to the gate of the second selector transistor. According to this structure, the first selector transistor and the second selector transistor can be easily turned on/off through the first selection line and the second selection line.

In the aforementioned structure having the bit lines and the word lines of the hierarchical structure, the second memory is preferably connected to the main bit line and provided every memory cell array. According to this structure, it is possible to make the second memory arranged every memory cell array function as a high-speed cache memory.

In the aforementioned structure having the bit lines and the word lines of the hierarchical structure, the semiconductor memory device preferably further comprises a transistor connected between the second memory and the main bit line. According to this structure, the second memory of a selected memory cell array and the main bit line can be connected with each other through this transistor. In this case, the semiconductor memory device preferably further comprises a third selection line connected to the gate of the transistor connected between the second memory and the main bit line. According to this structure, the transistor connected between the second memory and the main bit line can be easily turned on/off through the third selection line.

In the aforementioned semiconductor memory device according to the first aspect, the first memory preferably includes a ferroelectric memory, the second memory preferably includes a static memory, and the ferroelectric memory is preferably formed above the static memory in a stacked manner. According to this structure, it is possible to implement a memory system consisting of a ferroelectric memory and a static memory capable of attaining further miniaturization (thinning) and speed-up. Further, the ferroelectric memory requires no high voltage in writing dissimilarly to a flash memory, whereby it is possible to attain reduction of the voltage and reduction of power consumption.

In the aforementioned semiconductor memory device according to the first aspect, the first memory preferably includes a magnetic memory, the second memory preferably includes a static memory, and the magnetic memory is preferably formed above the static memory in a stacked manner. According to this structure, it is possible to implement a memory system consisting of a magnetic memory and a static memory capable of attaining further miniaturization (thinning) and speed-up.

In the aforementioned semiconductor memory device according to the first aspect, the said first memory preferably includes a phase change memory, the second memory preferably includes a static memory, and the phase change memory is preferably formed above the static memory in a stacked manner. According to this structure, it is possible to implement a memory system consisting of a phase change memory and a static memory capable of attaining further miniaturization (thinning) and speed-up.

In the aforementioned semiconductor memory device according to the first aspect, the said first memory preferably includes an anti-fuse ROM, the second memory preferably includes a static memory, and the anti-fuse ROM is preferably formed above the static memory in a stacked manner. According to this structure, it is possible to implement a memory system consisting of an anti-fuse ROM and a static memory capable of attaining further miniaturization (thinning) and speed-up.

In the aforementioned structure having the bit lines and the word lines of the hierarchical structure, the semiconductor memory device preferably further comprises frequency detection means arranged every memory cell array for detecting a write frequency and a read frequency of the memory cells of the first memory included in each memory cell array and refresh means performing rewriting with respect to the memory cells of the first memory included in the memory cell array on the basis of that the sum of the write frequency and the read frequency detected by the frequency detection means has reached a prescribed frequency. According to this structure, a refresh operation can be so periodically performed that it is possible to prevent such disturbance that data of non-selected cells of the first memory disappear. Further, the frequency detection means is so provided every memory cell array that the refresh operation can be performed every memory cell array, whereby it is possible to reduce the frequency of disturbance applied to the memory cells in refreshing as compared with a case of performing the refresh (rewrite) operation on all memory cells. Thus, no data disappears due to the refresh (rewrite) operation. In this case, the frequency detection means may include a counter.

In the aforementioned structure having the frequency detection means, the first memory are preferably formed on the semiconductor substrate in a stacked manner. According to this structure, it is possible to attain further miniaturization (thinning).

In the aforementioned semiconductor memory device according to the first aspect, the second memory is provided at the rate of one to the plurality of memory cells of the first memory. According to this structure, it is possible to further reduce influence exerted by the second memory on the degree of integration of the memory cells of the first memory as compared with a case of providing the second memory every memory cell of the first memory.

A semiconductor memory device according to a second aspect of the present invention comprises a nonvolatile first memory including memory cells arranged in the form of a matrix and a volatile second memory. The first memory and the second memory are formed on the identical semiconductor substrate in a stacked manner.

In this second semiconductor memory device according to the second aspect, as hereinabove described, the nonvolatile first memory and the volatile second memory are so formed on the identical semiconductor substrate in a stacked manner that the thickness in the height direction can be reduced, whereby it is possible to attain further miniaturization (thinning). Further, the first memory and the second memory are so formed on the semiconductor substrate in a stacked memory that no wire having a large parasitic capacitance or solder may be employed for connection of the first memory and the second memory but the memories can be closely arranged, whereby high-speed data transfer is enabled between the first memory and the second memory.

BEST MODES FOR CARRYING OUT THE INVENTION

Embodiments of the present invention are now described with reference to the drawings.

First Embodiment

Figure 1:
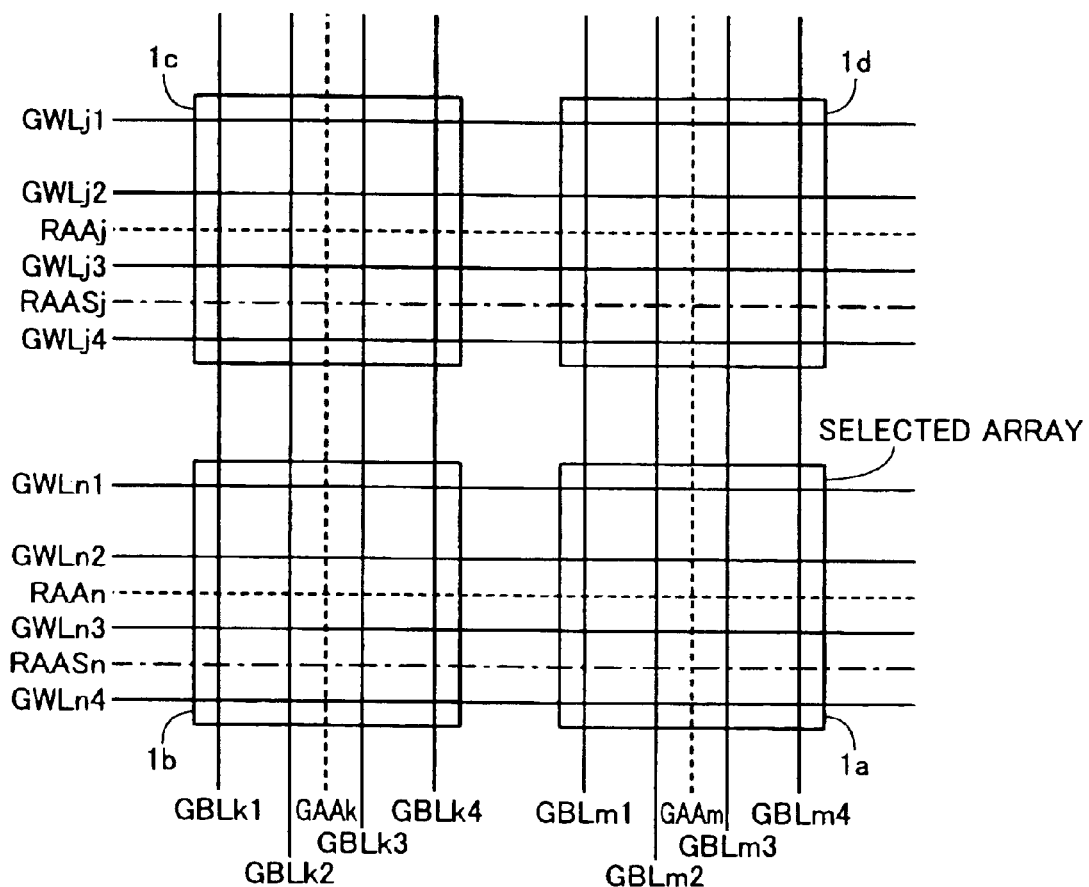
FIG. 1 is a plan view showing the overall structure of a semiconductor memory device according to a first embodiment of the present invention.
Figure 2:
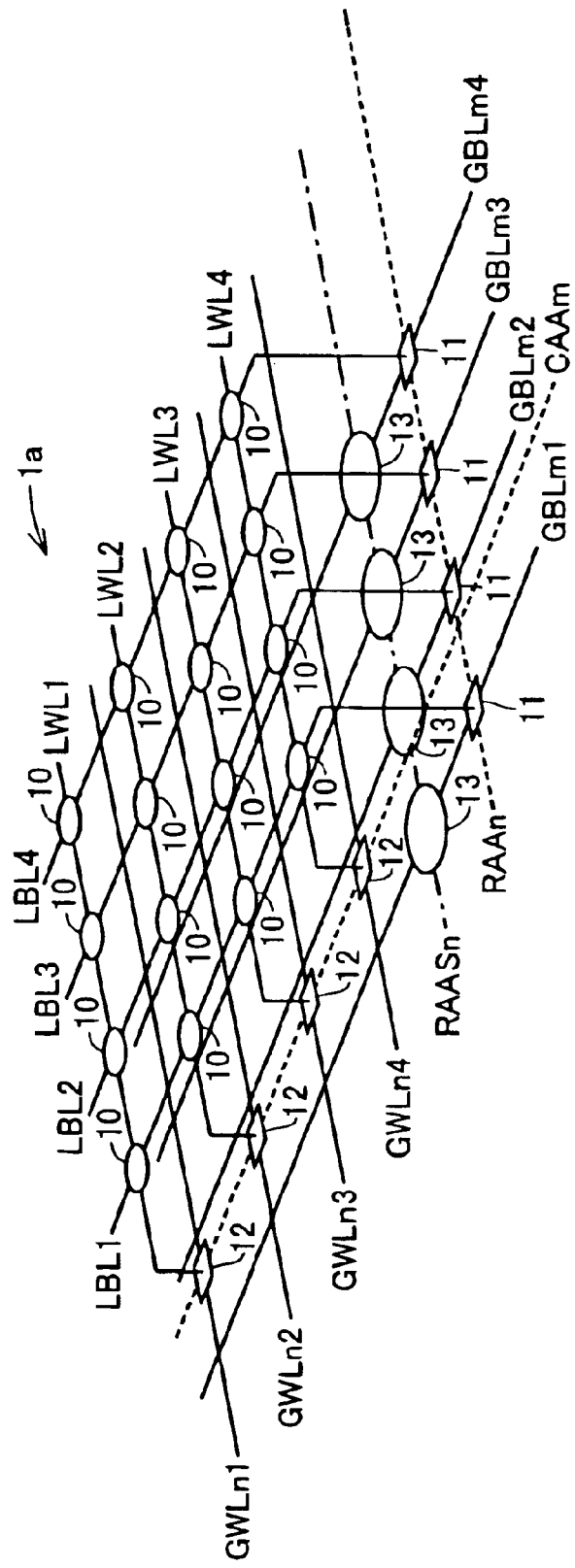
FIG. 2 is a model diagram conceptually showing the structure of a memory cell array part in the semiconductor memory device according to the first embodiment shown in FIG. 1.
Figure 4:
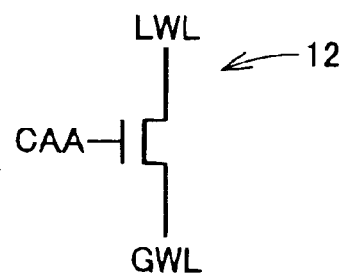
FIG. 4 is an equivalent circuit diagram showing a second selector transistor in the semiconductor memory device according to the first embodiment shown in FIG. 2.

As shown in FIGS. 1 and 2, 4×4=16 memory cells 10 of a nonvolatile ferroelectric memory (FeRAM) and 4-bit volatile SRAMs 13 are arranged on each of memory cell arrays 1a, 1b, 1c and 1d in a semiconductor memory device according to this first embodiment. The memory cells 10 of the ferroelectric memory are connected to local word lines LWL and local bit lines LBL. The local bit lines LBL are connected to global bit lines GBL through first selector transistors 11. The local word lines LWL are connected to global word lines GWL through second selector transistors 12.

The ferroelectric memory is an example of the "first memory" in the present invention, and the SRAMs 13 are examples of the "second memory" or the "static memory" in the present invention. The global word lines GWL are examples of the "main word line" in the present invention, and the local word lines LWL are examples of the "auxiliary word line" in the present invention. The global bit lines GBL are examples of the "main bit line" in the present invention, and the local bit lines LBL are examples of the "auxiliary word line" in the present invention.

The first selector transistors 11 are turned on/off through RAA lines (row array selection address lines). The second selector transistors 12 are turned on/off through CAA lines (column array selection address lines). The RAA lines are examples of the "first selection line" in the present invention, and the CAA lines are examples of the "second selection line" in the present invention.

Figure 3:
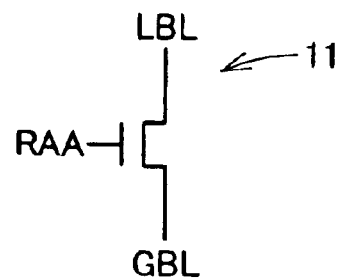
FIG. 3 is an equivalent circuit diagram showing a first selector transistor in the semiconductor memory device according to the first embodiment shown in FIG. 2.
Figure 5:
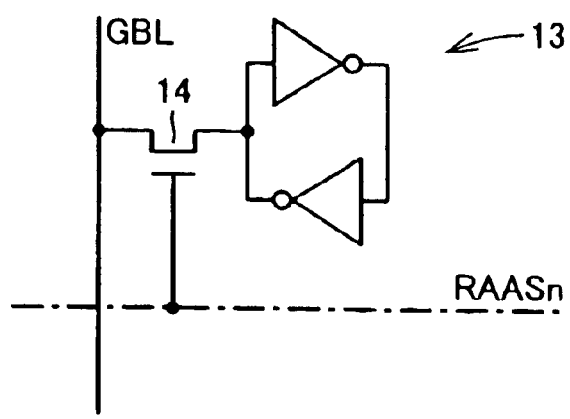
FIG. 5 is an equivalent circuit diagram showing the structure of an SRAM part in the semiconductor memory device according to the first embodiment shown in FIG. 2.

Each first selector transistor 11 is constituted of an n-channel MOS transistor as shown in FIG. 3, and each second selector transistor 12 is constituted of an n-channel transistor as shown in FIG. 4. Each RAA line is connected to the gate of the first selector transistor 11, and each CAA line is connected to the gate of the second selector transistor 12. Each SRAM 13 is constituted of two inverter circuits, as shown in FIG. 5. The SRAM 13 is connected to each global bit line GBL through a transistor 14, while each RAAS line is connected to the gate of the transistor 14. The RAAS line is an example of the "third selection line" in the present invention.

According to this first embodiment, the global bit lines GBL are shared by the ferroelectric memory and the SRAMs 13.

Figure 6:
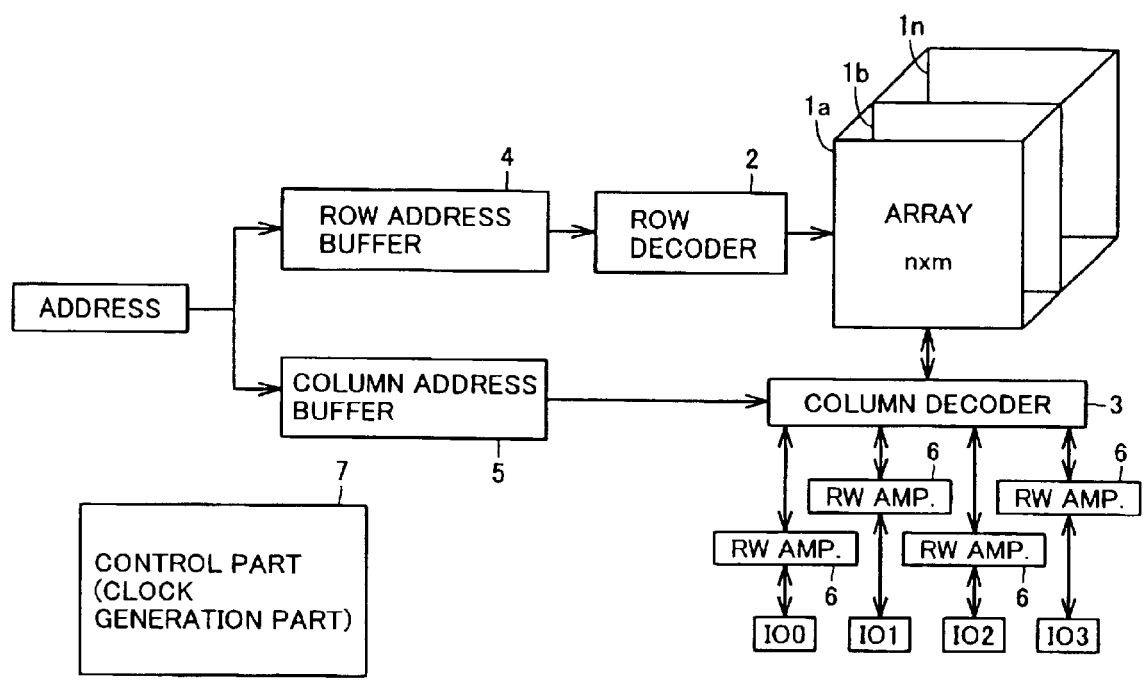
FIG. 6 is a block diagram showing the overall structure of a ferroelectric memory in the semiconductor memory device according to the first embodiment shown in FIG. 2.

The ferroelectric memory shown in FIG. 2 comprises a plurality of memory cell arrays 1a, 1b, ... 1n, a row decoder 2, a column decoder 3, a row address buffer 4, a column address buffer 5, a read/write amplifier 6 and a control part (clock generation part) 7, as shown in FIG. 6.

The plane layout of the semiconductor memory device according to the first embodiment shown in FIG. 2 and a sectional structure corresponding thereto are now described with reference to FIGS. 7 to 12.

Figure 7:
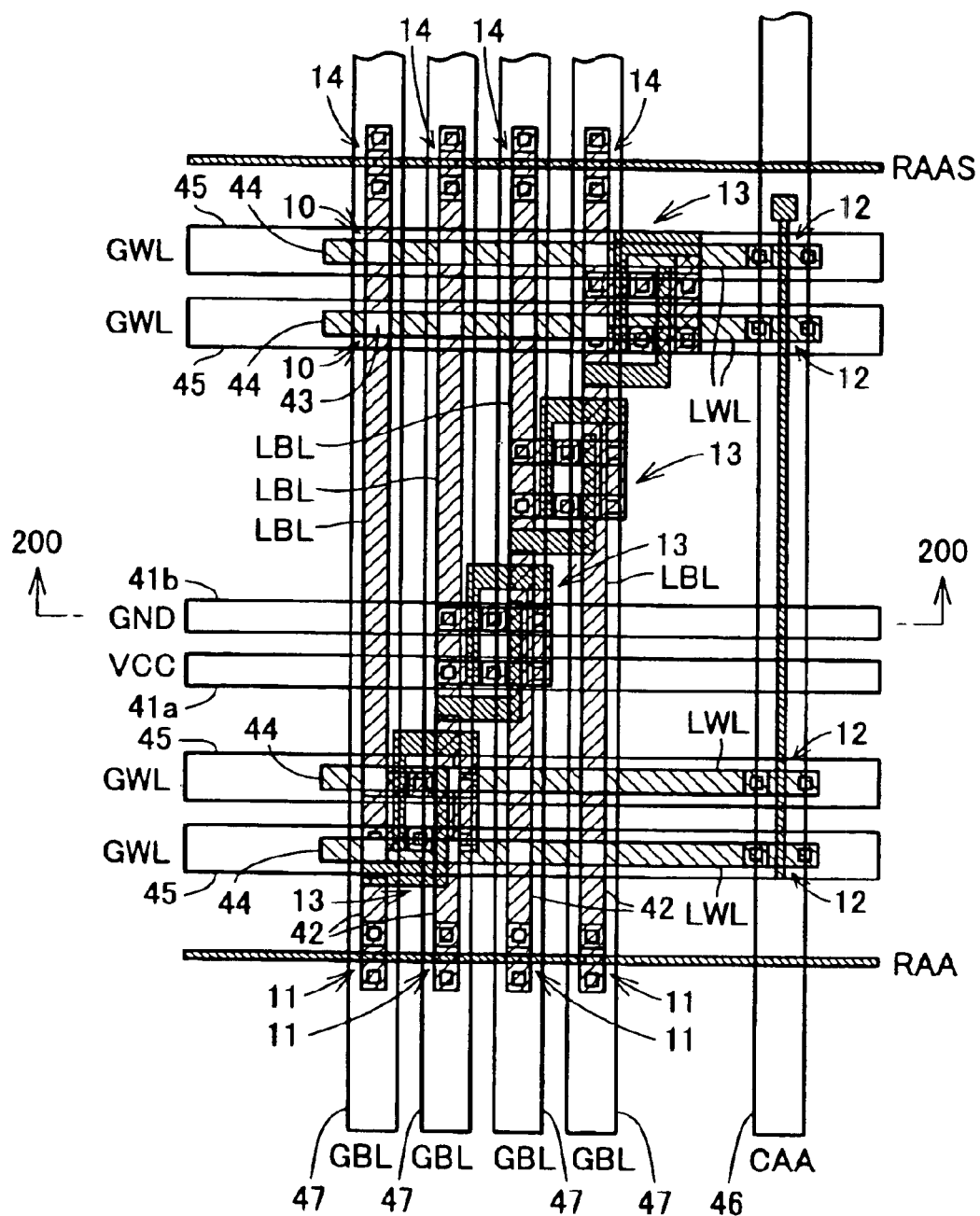
FIG. 7 is a plane layout diagram showing the overall structure of the semiconductor memory device according to the first embodiment of the present invention.
Figure 8:
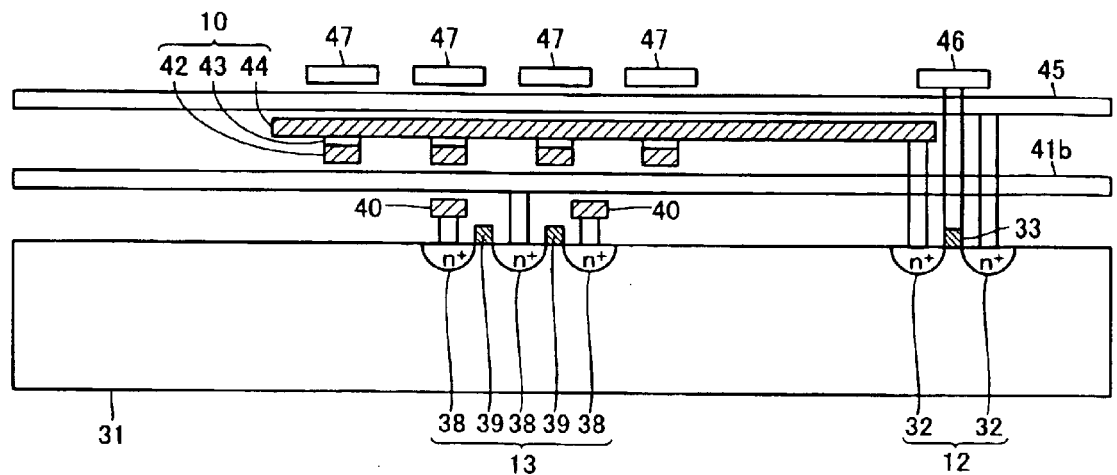
FIG. 8 is a sectional view of the semiconductor memory device according to the first embodiment shown in FIG. 7 taken along the line 200—200.

In the semiconductor memory device according to the first embodiment, the second selector transistors 12 each consisting of a pair of n-type source/drain regions 32 and a gate electrode 33 are formed on the surface of a p-type semiconductor substrate 31, as shown in FIGS. 7 and 8. Each CAA line 46 is connected to the gate electrode 33 of the second selector transistor 12. Two n-channel transistors consisting of n-type source/drain regions 38 and gate electrodes 39 are formed on the surface of the p-type semiconductor substrate 31. Each SRAM 13 is formed by these two n-channel transistors and two p-channel transistors not illustrated in the section of FIG. 8 (see FIG. 10).

Wiring layers 40 are connected to the n-type source/drain regions 38 on both ends of the n-channel transistors constituting the SRAM 13, while a GND line 41b is connected to the central n-type source/drain region 38.

A local word line (LWL) 44 is connected to one n-type source/drain region 32 of the second selector transistor 12. Local bit lines (LBL) 42 are formed on the lower surface of the local word line (LWL) 44 through ferroelectric layers 43. The simple matrix memory cells 10 consisting of ferroelectric capacitors are constituted of these local bit lines (LBL) 42, the ferroelectric layers 43 and the local word line (LWL) 44. The ferroelectric layers are examples of the "storage means" in the present invention.

A global word line (GWL) 45 is formed to be connected to the other n-type source/drain region 32 of the second selector transistor 12 while extending above the local word line (LWL) 44. Global bit lines (GBL) 47 are formed above the global word line (GWL) 45 to correspond to the local bit lines (LBL) 42.

In the plane layout diagram shown in FIG. 7 and the sectional structure shown in FIG. 8, the global word lines GWL and the global bit lines GBL are formed above the local word lines LWL and the local bit lines LBL, dissimilarly to the model diagram shown in FIG. 2. Thus, when it is intended to implement the hierarchical structure of the local word lines LWL and the local bit lines LBL as well as the global word lines GWL and the global bit lines GBL of the model diagram shown in FIG. 2 in practice, this results in the structure shown in FIGS. 7 and 8.

Figure 9:
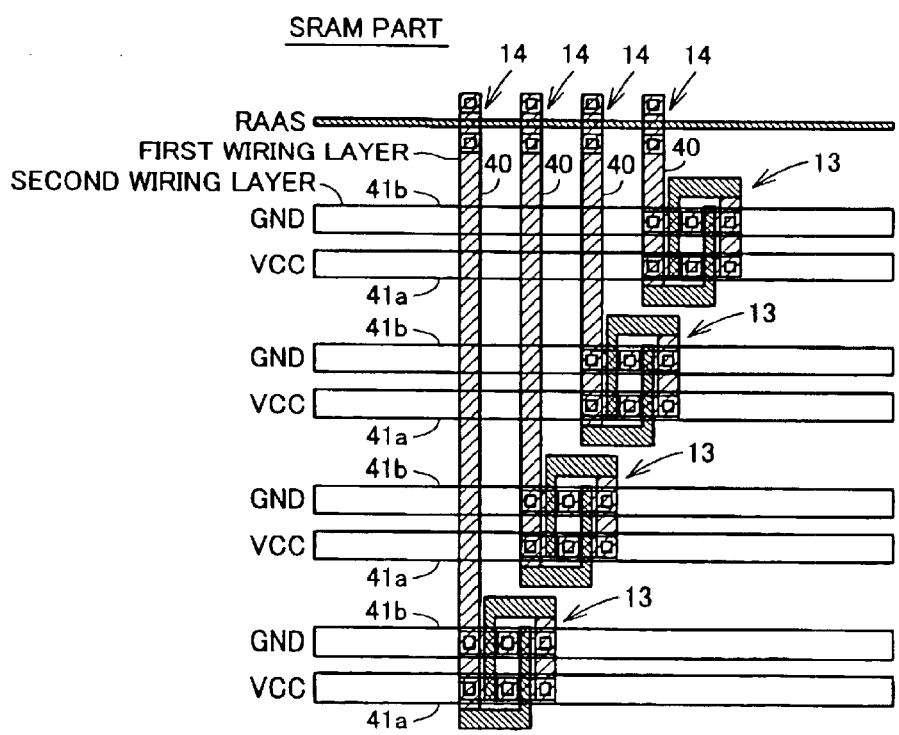
FIG. 9 is a plane layout diagram of the SRAM part of the semiconductor memory device according to the first embodiment of the present invention.
Figure 10:
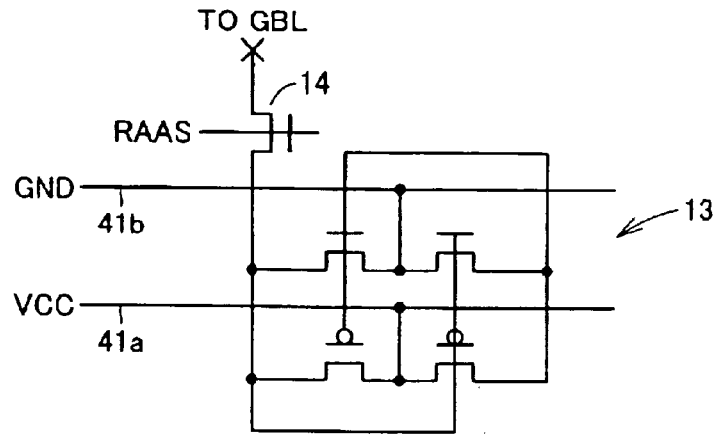
FIG. 10 is a circuit diagram corresponding to the plane layout diagram shown in FIG. 9.

As the plane layout of an SRAM part, the wiring layers 40 are formed by first wiring layers while Vcc lines 41a and GND lines 41b are formed by second wiring layers, as shown in FIG. 9. Further, the SRAM part includes two p-channel transistors and two n-channel transistors, as shown in FIG. 10.

Figure 11:
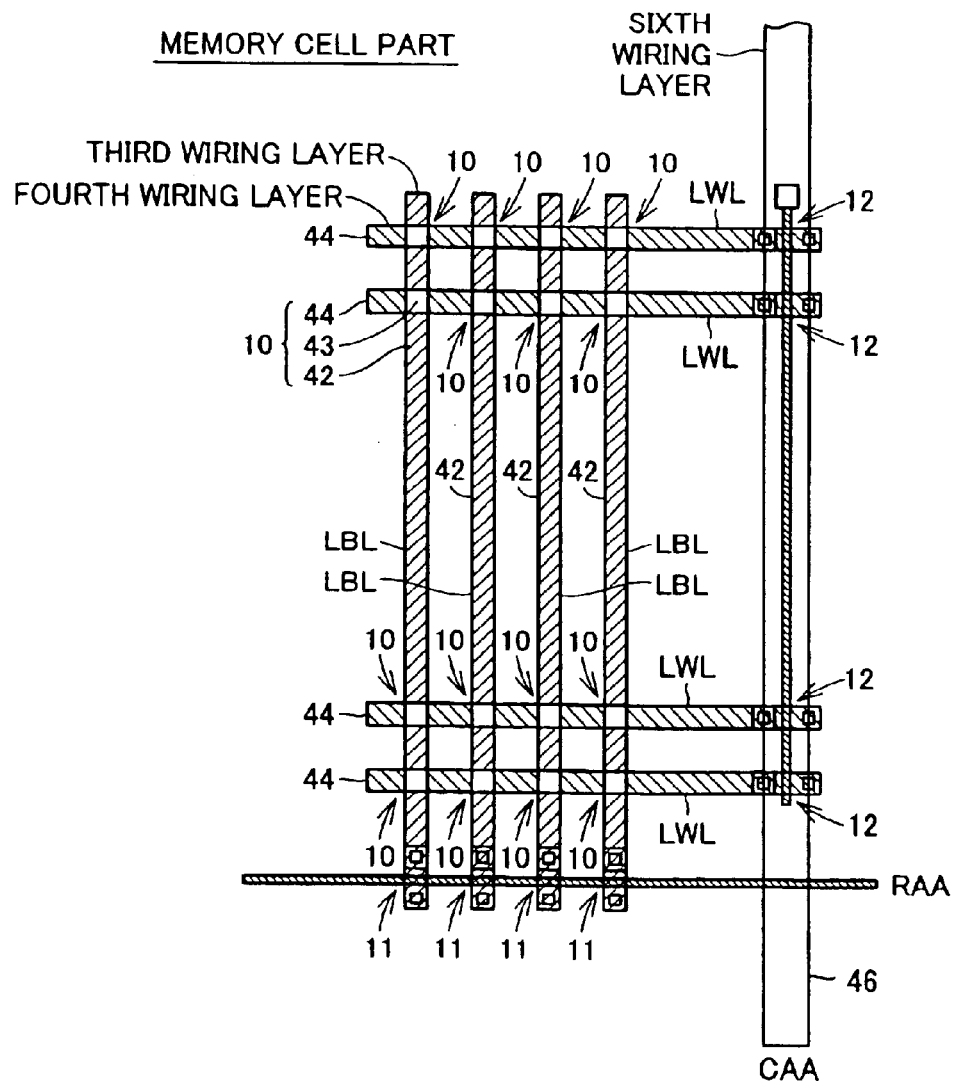
FIG. 11 is a plane layout diagram of the memory cell part of the semiconductor memory device according to the first embodiment of the present invention.

As the plane layout of a memory cell part, the local bit lines (LBL) 42 are formed by third wiring layers while the local word lines (LWL) 44 are formed by fourth wiring layers, as shown in FIG. 11. The ferroelectric layers 43 are arranged on the intersections between the local bit lines (LBL) 42 and the local word lines (LWL) 44.

Figure 12:
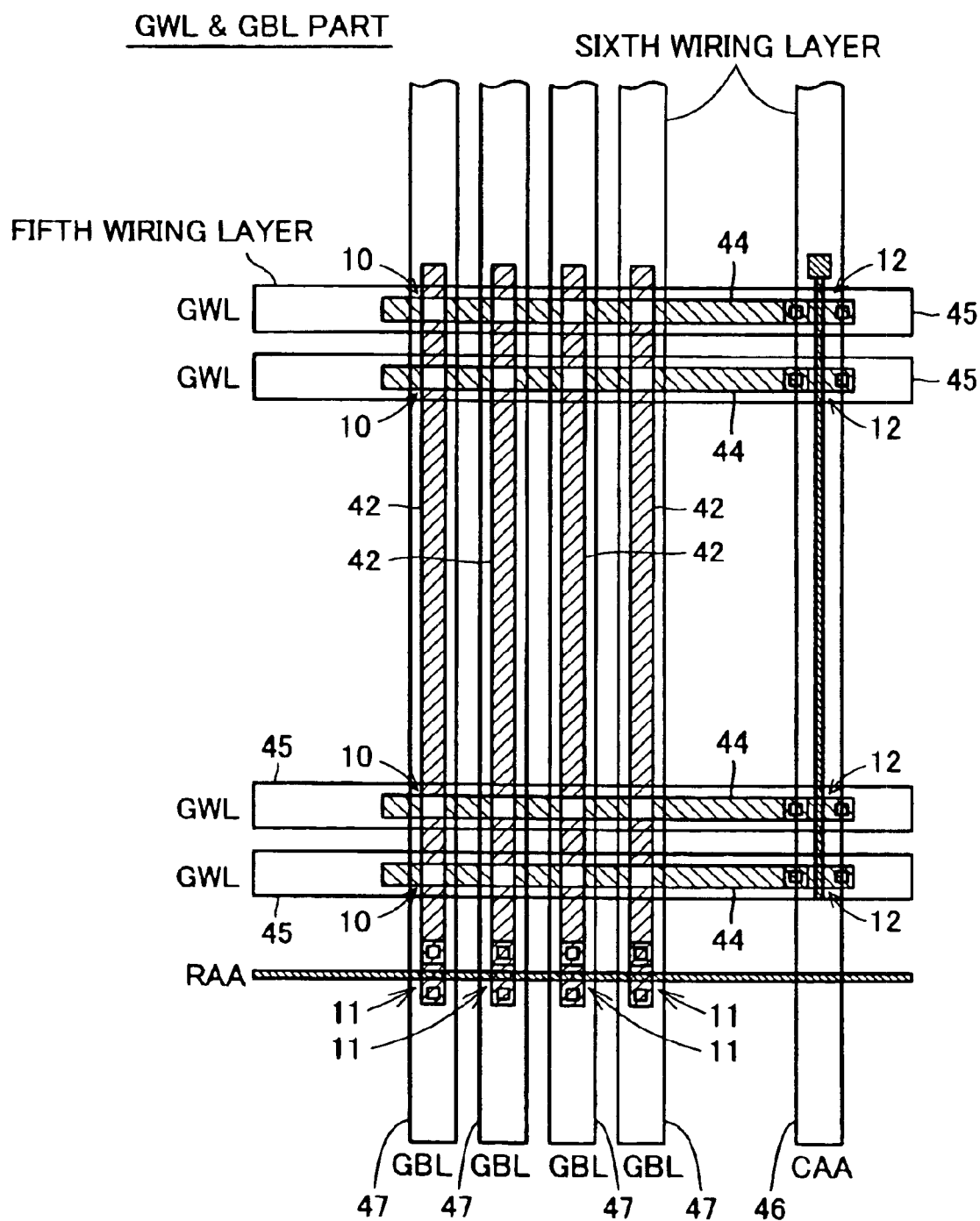
FIG. 12 is a plane layout diagram of a global word line and global bit line part of the semiconductor memory device according to the first embodiment of the present invention.

As the plane layout of a global word line (GWL) and global bit line (GBL) part, the global word lines (GWL) 45 are formed by fifth wiring layers while the global bit lines (GBL) 47 and the CAA lines 46 are formed by sixth wiring layers, as shown in FIG. 12.

The outline of operations of the semiconductor memory device according to the first embodiment constituted as described above is now described. A case of accessing four memory cells 10 of the ferroelectric memory connected to a local word line LWL2 in an array (n,m) shown in FIG. 2 is assumed here. In this case, the selected array is the array (n,m), whereby a CAAm line and an RAAn line are so activated that the array is first selected. Both of the first selector transistors 11 and the second selector transistors 12 enter ON states due to this activation of the CAAm line and the RAAn line, whereby local word lines LWL1 to 4 are connected to global word lines GWLn1 to n4 respectively while local bit lines LBL1 to 4 are connected to global bit lines GBLm1 to m4 respectively. Only the global word line GWLn2 is activated among the global word lines GWLn1 to n4, whereby only the local word line LWL2 is activated.

Thus, data of the four memory cells 10 connected to the local word line LWL2 appear on the four global bit lines GBLm1 to m4 respectively through the four first selector transistors 11. These four data are outwardly read by the read/write amplifier 6 (see FIG. 6) through the global bit lines GBLm1 to GBLm4. At the same time, the four data are rewritten (restored) in the four memory cells 10 connected to the local word line LWL2 through the global bit lines GBLm1 to m4, the first selector transistors 11 and the local bit lines LBL1 to 4.

The transistors 14 (see FIG. 5) enter ON states due to the activation of the RAASn line, whereby the SRAMs 13 are connected to the global bit lines GBLm1 to m4. Therefore, it follows that the data (restored data) rewritten in the four memory cells 10 are held also in the SRAMs 13.

Also in the case of writing, write data are held in the four SRAMs 13 connected to the global bit lines GBLm1 to m4. Therefore, it follows that finally accessed data are held in the SRAMs 13 in each array, whereby it follows that the SRAMs 13 function as cache memories.

Voltages in respective operation modes are shown in the following Table 1:

TABLE 1

| | Standby | Read from FeRAM | Write in FeRAM | Access SRAM |
|---|---|---|---|---|
| GWLn2 (selected) | ½ Vcc | Vcc | 0 | ½ Vcc |
| LWLn2 (selected) | ½ Vcc | Vcc | 0 | ½ Vcc |
| GWLn1 (non-selected) | ½ Vcc | ½ Vcc | ½ Vcc | ½ Vcc |
| LWLn1 (non-selected) | ½ Vcc | ½ Vcc (floating) | ½ Vcc (floating) | ½ Vcc |
| GBLm1 (selected) | ½ Vcc | Data | Data | Data |
| LBLm1 (selected) | ½ Vcc | Data | Data | Data |
| GBLk1 (non-selected) | ½ Vcc | ½ Vcc | ½ Vcc | ½ Vcc |
| LBLk1 (non-selected) | ½ Vcc | ½ Vcc (floating) | ½ Vcc (floating) | ½ Vcc |
| RAAn (selected) | Vcc | Vcc | Vcc | 0 |
| RAAj (non-selected) | Vcc | 0 | 0 | 0 |
| CAAm (selected) | Vcc | Vcc+ | Vcc+ | Vcc |
| CAAk (non-selected) | Vcc | 0 | 0 | 0 |
| RAASn (selected) | 0 | 0 | Vcc+ | Vcc+ |
| RAASj (non-selected) | 0 | 0 | 0 | 0 |

The details of operations of the semiconductor memory device according to the first embodiment in the respective operation modes are now described with reference to the above Table 1 and FIGS. 1 to 6.

(Standby Mode)

In this standby (waiting) mode, the semiconductor memory device applies ½Vcc to all global word lines GWL and global bit lines GBL while applying Vcc to all RAA 10 lines and CAA lines. Thus, all first selector transistors 11 and second selector transistors 12 enter ON states, whereby all global word lines GWL and all local word lines LWL are connected with each other while all global bit lines GBL and all local bit lines LBL are connected with each other. Therefore, all local word lines LWL and local bit lines LBL reach ½Vcc. In this case, all RAAS lines are set to 0 V, whereby all SRAMs 13 enter states separated from the global bit lines GBL. Thus, all SRAMs 13 are in states where data are held. Further, both ends (the local word lines LWL and the local bit lines LBL) of all memory cells 10 of the ferroelectric memory are in states where ½Vcc is applied. Thus, the memory cells 10 are also in states where data are held.

(Read Mode of Ferroelectric Memory)

When the address of the selected array is decided, RAA lines and CAA lines other than those of the selected array reach 0 V. The RAA lines and the CAA lines of the selected array remain in the standby mode, where Vcc is applied. Thus, the local word lines LWL and local bit lines LBL of all non-selected arrays not sharing the RAA lines and the CAA lines with the selected array are separated from the global word lines GWL and the global bit lines GBL, to enter floating states at ½Vcc.

The global bit lines GBL of the selected array are lowered to 0 V and thereafter enter floating states. In this case, Vcc is applied to the RAA lines of the selected array, and hence the first selector transistors 1 connected to the RAA lines of the selected array are regularly in ON states. Therefore, the global bit lines GBL and the local bit lines LBL of the selected array are regularly in connected states, whereby local bit lines LBL of the selected array are also lowered to 0 V and thereafter enter floating states.

Then, the CAA lines of the selected array are stepped up from Vcc to a voltage Vcc+ obtained by adding the threshold voltage of the second selector transistors 12 to Vcc, in order to prevent a voltage drop caused by the threshold voltage. The global word line GWLn2 rises to Vcc, whereby the local word line LWL2 rises to Vcc through the second selector transistors 12.

Therefore, the data of the memory cells 10 connected to the local word line LWL2 appear on the global bit lines GBLm1 to m4 through the local bit lines LBL1 to 4 and the first selector transistors 11. These data are read by the read/write amplifier 6 (see FIG. 6).

(Restore (Rewrite) Mode)

The read data defined by the read/write amplifier 6 are returned to the local bit lines LBL1 to 4 of the selected array by the read/write amplifier 6 through the global bit lines GBLm1 to m4. In other words, Vcc is applied to the local bit lines LBL for selected cells from which data "1" are read while 0 V is applied to the local bit lines LBL for selected cells from which data "0" are read. At this time, the selected word line LWL2 remains at Vcc, and hence the data "0" are restored (rewritten) in the selected cells from which the data "0" are read. Then, the selected word line falls to 0 V, whereby the data "1" are restored (rewritten) in the cells from which the data "1" are read. Meanwhile, the RAASn line is made to rise to Vcc+, whereby the read data are written and held also in the SRAMs 13 of the selected array.

Also as to a write operation, the operation is identical except that the aforementioned restored data are replaced with write data input from an I/O pad.

(SRAM Access Mode)

From the standby state, the semiconductor memory device first sets all RAA lines to 0 V, thereby separating the global bit lines GBL and the local bit lines LBL from each other. Then, the semiconductor memory device brings all global bit lines GBL into floating states. Thereafter the semiconductor memory device makes the RAASn line rise thereby connecting the global bit lines GBL and the SRAMs 13 with each other for performing access.

In the semiconductor memory device according to the first embodiment, as hereinabove described, the ferroelectric memory and the SRAMs 13 are formed on the same p-type semiconductor substrate 31 in a stacked manner so that the thickness in the height direction can be reduced, whereby further miniaturization (thinning) can be attained.

Further, the ferroelectric memory and the SRAMs 13 are formed on the same p-type semiconductor substrate 31 in a stacked manner so that no wires having large parasitic capacitances or solder may be employed for connection of the ferroelectric memory and the SRAMs 13 but the ferroelectric memory and the SRAMs 13 can be closely arranged, whereby high-speed data transfer is enabled between the ferroelectric memory and the SRAMs.

In the semiconductor memory device according to the first embodiment, further, the global bit lines GBL are shared by the ferroelectric memory and the SRAMs 13, whereby the structure can be simplified as compared with a case of separately providing the global bit lines GBL respectively.

In the semiconductor memory device according to the first embodiment, in addition, the hierarchical structure employing the global word lines GWL and the global bit lines GBL as well as the local word lines LWL and the local bit lines LBL is so attained that the wires (the local word lines LWL and the local bit lines LBL) connected to the memory cells 10 are shortened, whereby wiring capacitances are reduced. High-speed reading can be performed also according to this.

In the semiconductor memory device according to the first embodiment, further, the SRAMs 13 are provided every memory cell array and connected to the global bit lines GBL, whereby the SRAMs 13 arranged every array can be made to function as high-speed cache memories.

Further, the ferroelectric memory included in the semiconductor memory device according to the first embodiment requires no high voltage in writing dissimilarly to a flash memory, whereby reduction of voltages and power consumption can be attained.

(Second Embodiment)

A semiconductor memory device according to this second embodiment has a structure storing a counter part for counting an access frequency to memory cells every memory cell array, in addition to the aforementioned structure of the first embodiment.

Figure 13:
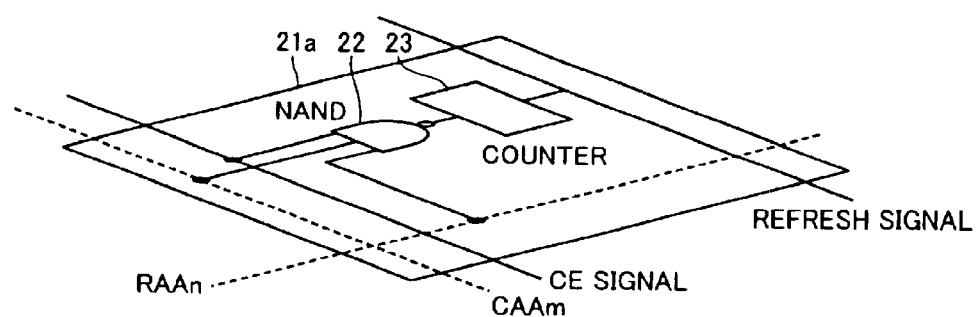
FIG. 13 is a perspective view for illustrating the structure of a counter part of a semiconductor memory device according to a second embodiment of the present invention.

More specifically, a NAND circuit 22 and a counter part 23 connected to an output of the NAND circuit 22 are provided every memory cell array 21a, . . . in this second embodiment, as shown in FIG. 13. This counter part 23 is an example of the "frequency detection means" in the present invention. A CE (chip enable) signal, a signal from a CAAm line and a signal from an RAAn line are input in an input of the NAND circuit 22. A refresh (REFRESH) signal is output from an output of the counter part 23. This refresh signal is a signal for performing a rewrite operation in the memory cells in response to that the sum of write and read frequencies of memory cells 10 (see FIG. 2) has reached a prescribed count value.

Figure 14:
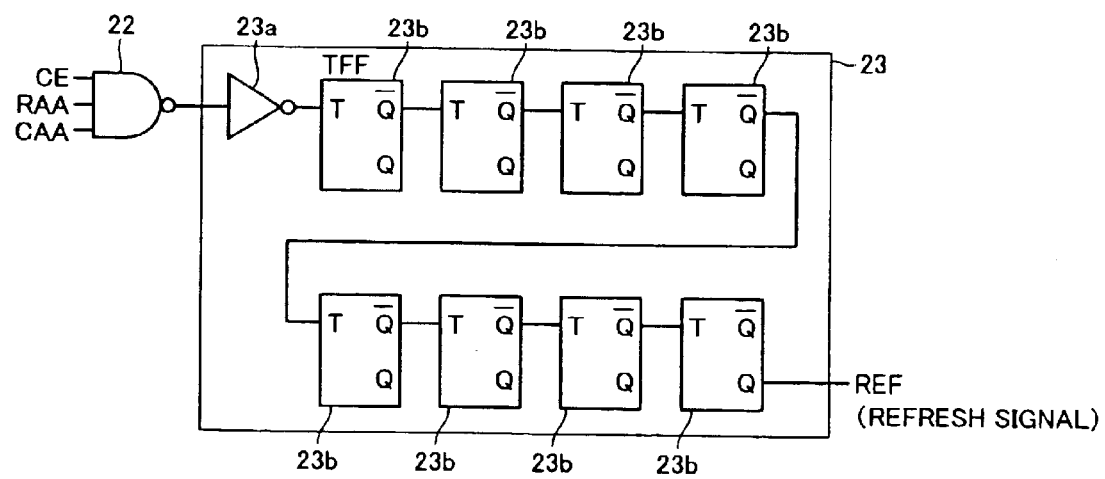
FIG. 14 is an equivalent circuit diagram showing the internal structure of the counter part according to the second embodiment shown in FIG. 13.

In other words, this semiconductor memory device according to the second embodiment comprises the counter part 23 for detecting the write frequency and the read frequency of the memory cells 10 and refresh means performing rewriting in the memory cells on the basis of that the sum of the write frequency and the read frequency detected by the counter part 23 has reached the prescribed frequency (256). The control part 7 of the first embodiment shown in FIG. 6 is employed as this refresh means. The counter part 23 includes an inverter circuit 23a and a plurality of (eight) TFFs (trigger flip-flops) 23b, as shown in FIG. 14. Each TFF 23b is constituted of two latch parts consisting of two inverters and two transfer gates and a transfer gate connecting these latch parts with each other, although not illustrated.

The plane layout in the semiconductor memory device according to the second embodiment and a sectional structure corresponding thereto are now described with reference to FIGS. 15 to 17. In this second embodiment, a second selector transistor 12 consisting of a pair of n-type source/drain regions 32 and a gate electrode 33 is formed on the surface of a p-type semiconductor substrate 31, as shown in FIG. 16.

Further, the NAND circuit 22 consisting of three n-channel transistors constituted of four n-type source/drain regions 51 and three gate electrodes 52 is formed on the surface of the p-type semiconductor substrate 31. In addition, the counter part 23 including two n-channel transistors constituted of three n-type source/drain regions 53 and two gate electrodes 54 is formed on the surface of the p-type semiconductor substrate 31. The left-end n-type source/drain region 51 constituting the NAND circuit 22 is connected to one gate electrode 54 constituting either n-channel transistor of the counter part 23. A GND line 41b is connected to the intermediate n-type source/drain region 53 of the counter part 23, while a refresh signal line (REF) 55 is connected to the left-side n-type source/drain region 53.

A CAA line 46 is connected to the gate electrode 33 constituting the second selector transistor 12. A local word line (LWL) 44 is connected to one n-type source/drain region 32, while a global word line (GWL) 45 is connected to the other n-type source/drain region 32. Local bit lines (LBL) 42 are formed under the local word line (LWL) 44 through ferroelectric layers 43. The memory cells 10 consisting of ferroelectric capacitors are constituted of this local word line (LWL) 44, the ferroelectric layers 43 and the local bit lines (LBL) 42. Global bit lines (GBL) 47 are formed above the global word line (GWL) 45, to correspond to the local bit lines (LBL) 42.

Figure 15:
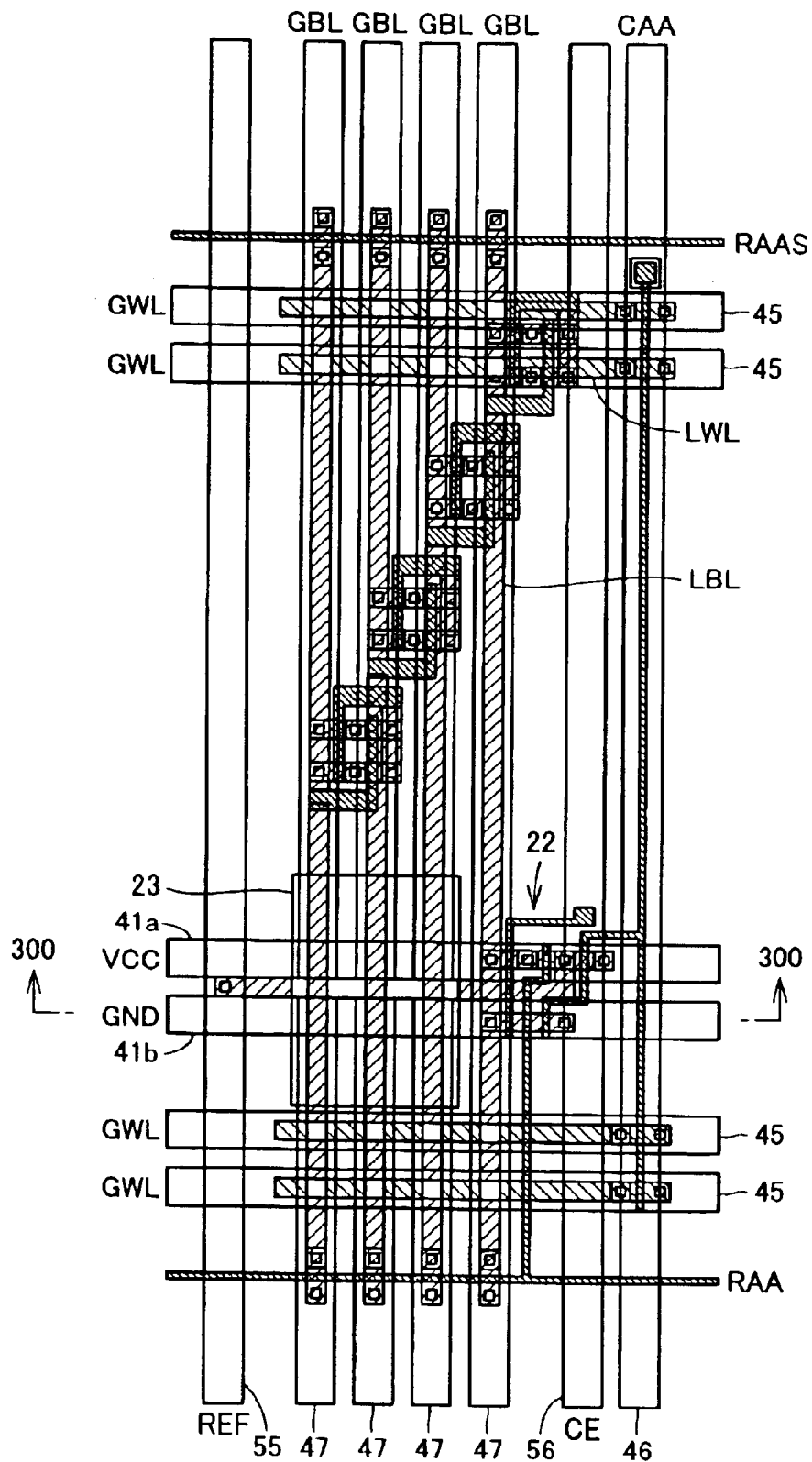
FIG. 15 is a plane layout diagram of the semiconductor memory device according to the second embodiment of the present invention.
Figure 16:
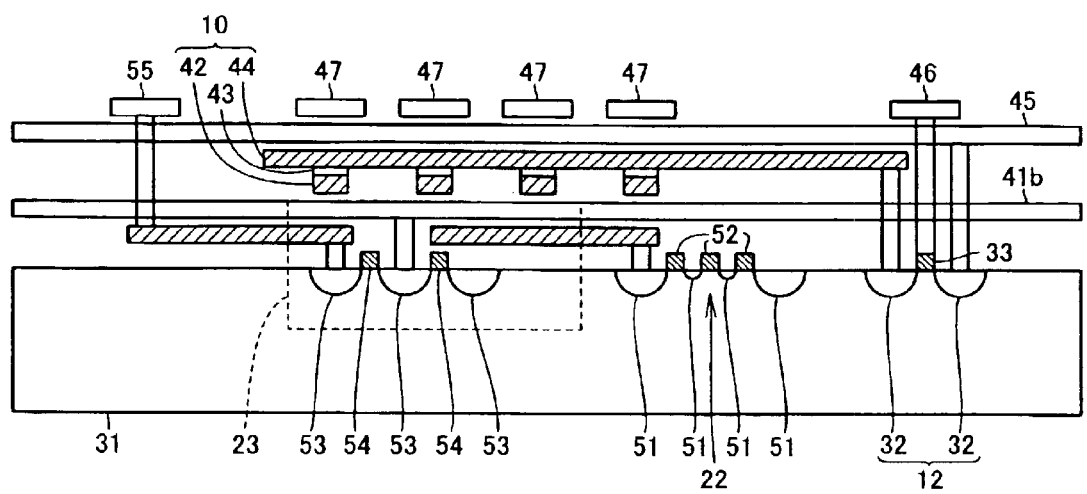
FIG. 16 is a sectional view of the semiconductor memory device according to the second embodiment shown in FIG. 15 taken along the line 300—300.
Figure 17:
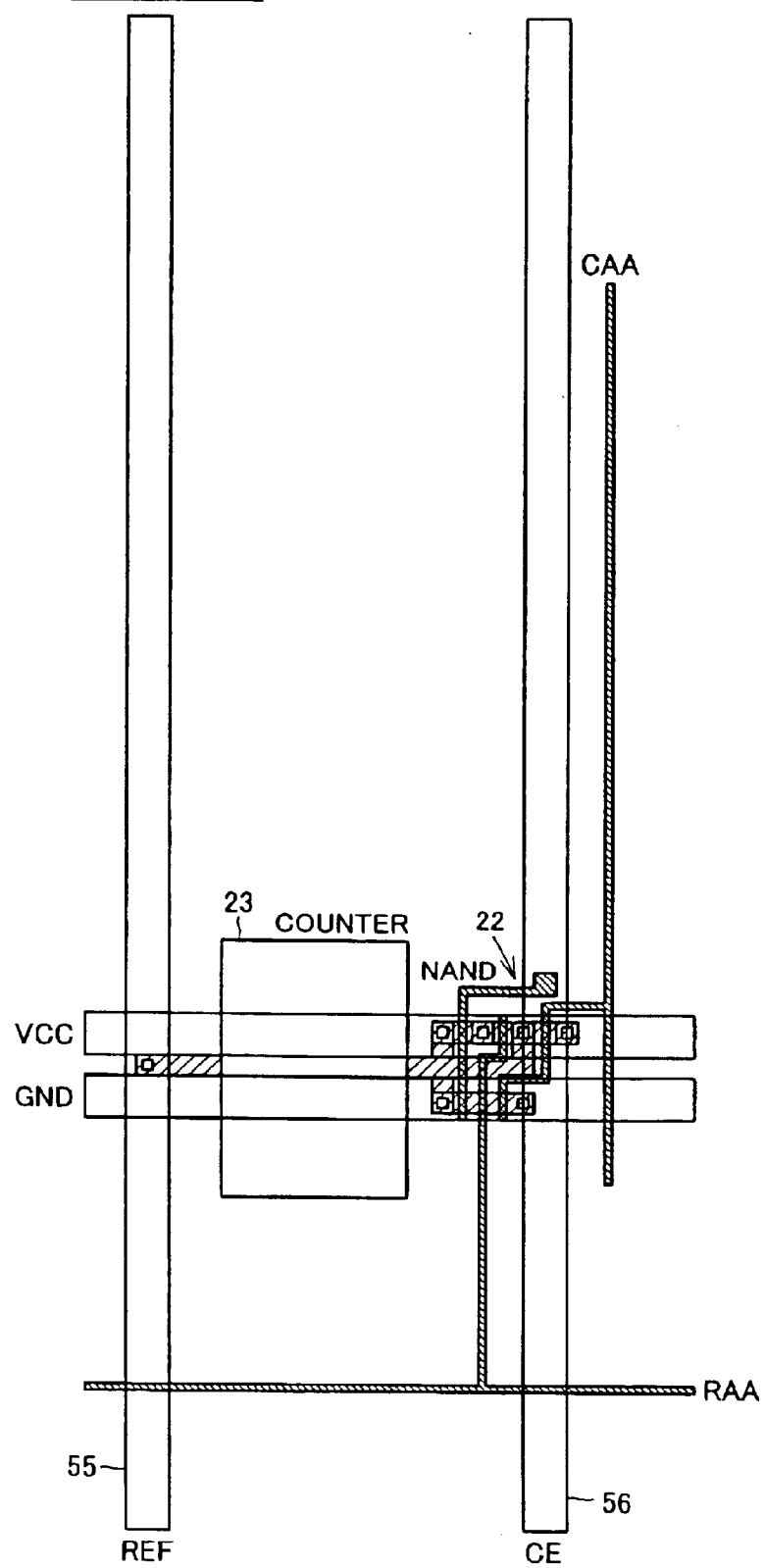
FIG. 17 is a plane layout diagram of the counter part of the semiconductor memory device according to the second embodiment of the present invention.

The plane layout diagram of the counter part 23 is in a layout shown in FIGS. 15 and 17. The NAND circuit 22 is connected to a CE (chip enable) line 56.

As hereinabove described, the counter part 23 is positioned under the memory cells 10 of a ferroelectric memory. In other words, the counter part 23 and the NAND circuit 22 as well as the memory cells 10 of the ferroelectric memory are formed on the same p-type semiconductor substrate 31 in a stacked manner.

Operations of the semiconductor memory device according to the second embodiment having the aforementioned structure in respective operation modes are basically similar to those of the aforementioned first embodiment. A count-up operation and a refresh (rewrite) operation specific to this second embodiment are now described.

As the count-up operation, the semiconductor memory device counts up the counter part 23 one by one every time either a write operation or a read operation is performed on the memory cells 10 of the ferroelectric memory in a prescribed memory cell array 21a (see FIG. 13), for example. In this case, rewriting after reading is also included in the write frequency. When the sum of this read frequency and the write frequency reaches a prescribed frequency, the semiconductor memory device performs refreshing (rewriting) of the memory cell array 21a. More specifically, the semiconductor memory device ANDs the CAA line, the RAA line and the CE (chip enable) line every array as an input of the NAND circuit 22, thereby outputting a count-up trigger signal from the NAND circuit 22.

If the counter is of 256 bits, for example, the refresh signal (REFRESH signal) is activated when access is made to this memory cell array 21a 256 times. Thus, rewriting (refresh operation) is performed on this memory cell array 21a. This refresh operation is an operation of reading memory cells 10 in the memory cell array 21a one by one and performing rewriting.

In the second embodiment, as hereinabove described, the semiconductor memory device performs the refresh operation when the sum of the write frequency and the read frequency of the memory cells 10 included in the memory cell array 21a reaches the prescribed value (256 times) so that the refresh operation can be periodically performed, whereby it is possible to effectively prevent disturbance, which is such a phenomenon that data of non-selected cells of the ferroelectric memory disappear. Thus, a simple matrix ferroelectric memory excellent in implementation of a high degree of integration and capable of performing high-speed writing without requiring a high voltage for writing can be easily put into practice.

In the second embodiment, further, the counter part 23 is provided every memory cell array as hereinabove described so that the refresh operation can be performed every memory cell array, whereby the frequency of disturbance applied to the memory cells 10 in refreshing can be reduced as compared with a case of performing the refresh (rewrite) operation on all memory cells. Thus, no data disappear following the refresh (rewrite) operation.

In the second embodiment, in addition, the counter part 23 and the ferroelectric memory are formed on the p-type semiconductor substrate 31 in a stacked manner so that the thickness in the height direction can be reduced, whereby further miniaturization (thinning) can be attained.

The embodiments disclosed this time must be considered as illustrative and not restrictive in all points. The scope of the present invention is shown not by the above description of the embodiments but by the scope of claim for patent, and all modifications within the meaning and the scope equivalent to the scope of claim for patent are further included.

For example, while each of the aforementioned embodiments has shown an example of forming a nonvolatile simple matrix ferroelectric memory and volatile SRAMs (static memories) on the same semiconductor substrate in a stacked manner, the present invention is not restricted to this but another simple matrix memory including bit lines, word lines arranged to intersect with the bit lines and storage means arranged between the bit lines and the word lines or still another nonvolatile memory including memory cells arranged in the form of a matrix may be employed in place of the ferroelectric memory. For example, a magnetic memory (MRAM: Magnetic Random Access Memory), a phase change memory (OUM: Ovonic Unified Memory) or an anti-fuse (anti-fuse) ROM or the like may be employed. In addition, nonvolatile memories such as DRAMs other than SRAMs may be employed in place of the SRAMs.

Further, a control circuit or the like may be arranged in place of either the ferroelectric memory or the SRAMs. For example, a control circuit for the ferroelectric memory may be arranged under the ferroelectric memory in place of the SRAMs.

While the SRAMs and the ferroelectric memory share the global bit lines in each of the aforementioned embodiments, the present invention is not restricted to this but at least either the bit lines or the word lines may be shared in a case of employing a combination of other memories.

While the semiconductor memory device employs the counter as the frequency detection means detecting the write frequency and the read frequency of the memory cells of the ferroelectric memory in the aforementioned second embodiment, the present invention is not restricted to this but frequency detection means other than the counter may be employed.

Figure 18:
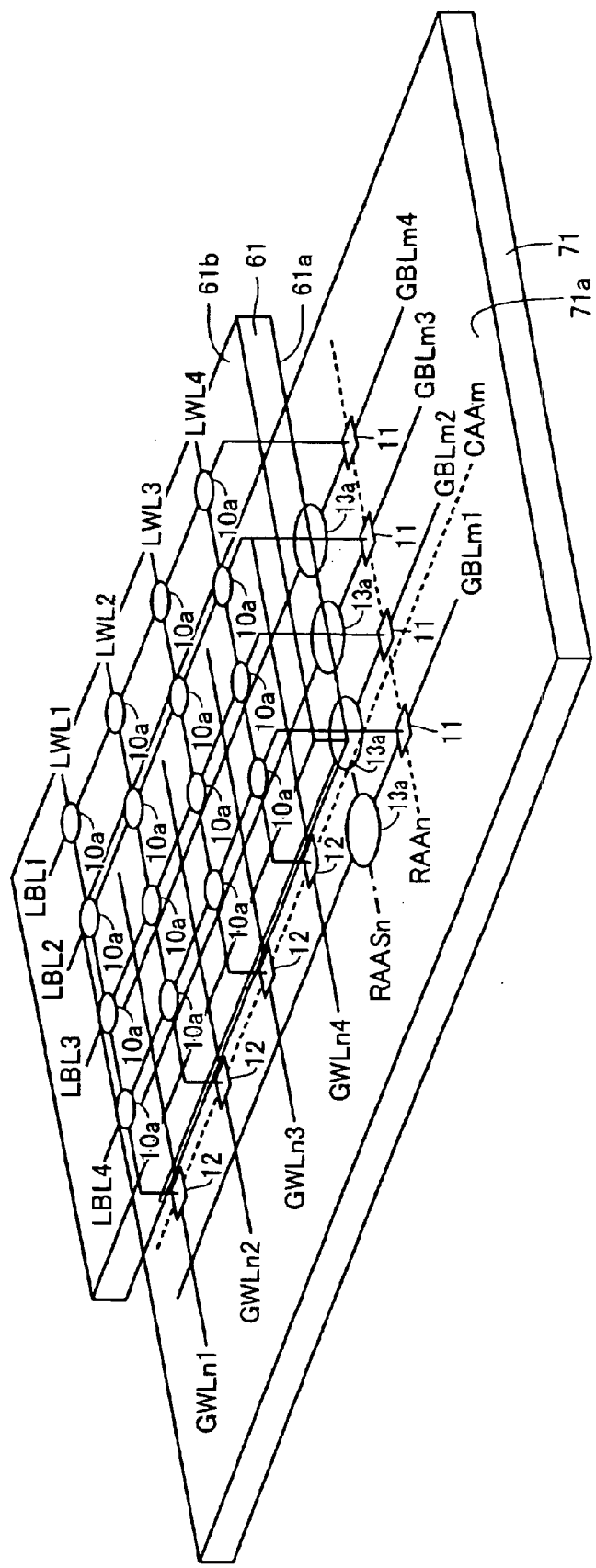
FIG. 18 is a perspective view showing a semiconductor memory device according to a modification of the first or second embodiment of the present invention.

While each of the aforementioned first and second embodiments has shown the example of forming the non-volatile simple matrix ferroelectric memory and the volatile SRAMs (static memories) on the same semiconductor substrate, the present invention is not restricted to this but semiconductor substrates 6 and 71 may be pasted to each other after forming a ferroelectric memory or the like and SRAMs or the like on the different semiconductor substrates 61 and 71 respectively, as shown in a modification of FIG. 18.

Figure 19:
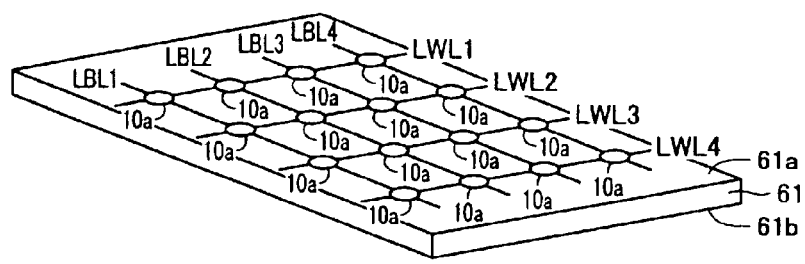
FIG. 19 is a perspective view for illustrating a fabrication process for the semiconductor memory device according to the modification shown in FIG. 18.
Figure 20:
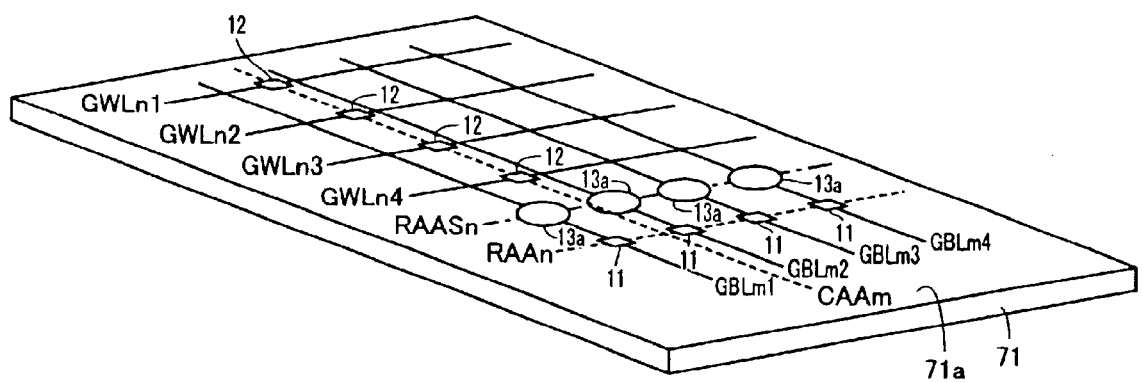
FIG. 20 is a perspective view for illustrating the fabrication process for the semiconductor memory device according to the modification shown in FIG. 18.
Figure 21:
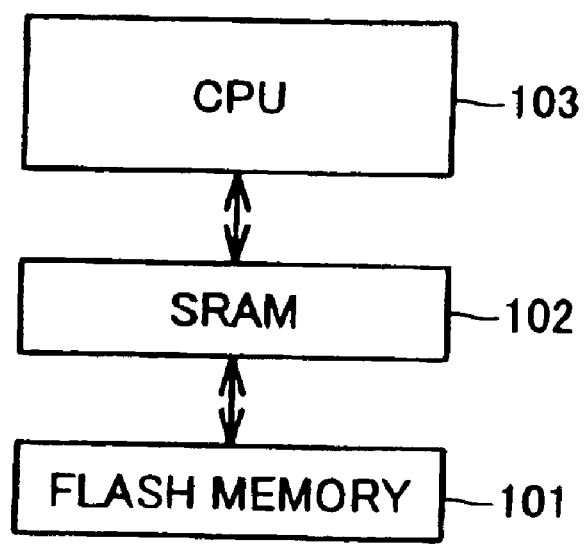
FIG. 21 is a block diagram showing the structure of a conventional memory system including an SRAM and a flash memory.
Figure 22:
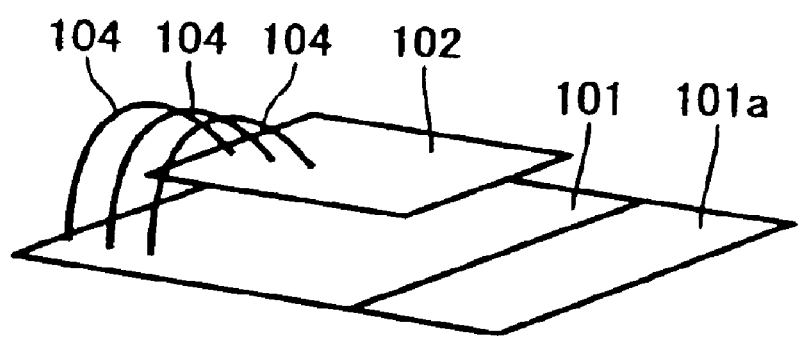
FIG. 22 is a perspective view showing the structure of a conventional semiconductor package including an SRAM chip and a flash memory chip.

More specifically, memory cells 10a of the ferroelectric memory or the like, local word lines LWL and local bit lines LBL or the like are formed on a surface 61a of the semiconductor substrate 61, as shown in FIG. 19. Memory cells 13a of the SRAMs or the like, RAA lines (row array selection address lines, CAA lines (column array selection address lines), RAAS lines, a control circuit (not shown) and the like are formed on a surface 71a of the semiconductor substrate 71, as shown in FIG. 20. The semiconductor substrate 61 shown in FIG. 19 is pasted onto the surface 71a of the semiconductor substrate 71 shown in FIG. 20 in a state directing a back surface 61b of the semiconductor substrate 61 shown in FIG. 19 upward. Thus, the structure shown in FIG. 18 is obtained. Connection between wires on the side of the semiconductor substrate 61 and wires on the semiconductor substrate 71 side is performed with plug electrodes or the like embedded in contact holes (via holes) provided in an interlayer dielectric film arranged between both substrates, for example.

What is claimed is:

1. A semiconductor memory device comprising:
   a first memory including a bit line, a word line arranged to intersect with said bit line and storage means arranged between said bit line and said word line; and
   a second memory different in type from said first memory, wherein
   said first memory and said second memory are formed on a semiconductor substrate.

2. The semiconductor memory according to claim 1, wherein said first memory and said second memory are formed on the identical semiconductor substrate in a stacked manner.

3. The semiconductor memory device according to claim 1, wherein at least either said word line or said bit line is shared by said first memory and said second memory.

4. The semiconductor memory device according to claim 1, wherein said first memory includes a plurality of memory cell arrays each including a plurality of memory cells,
   said bit line includes a main bit line and an auxiliary bit line connected to said main bit line and arranged every said memory cell array,
   said word line includes a main word line and an auxiliary word line connected to said main word line and arranged every said memory cell array, and
   the memory cells of said first memory are connected to said auxiliary word line and said auxiliary bit line.

5. The semiconductor memory device according to claim 4, wherein said first memory includes a ferroelectric memory, and
   the memory cells of said ferroelectric memory include said auxiliary bit line, said auxiliary word line and a ferroelectric layer serving as said storage means arranged between said auxiliary bit line and said auxiliary word line.

6. The semiconductor memory device according to claim 5, wherein said second memory includes a static memory, and
   said main bit line is shared by the ferroelectric memory constituting said first memory and the static memory constituting said second memory.

7. The semiconductor memory device according to claim 4, wherein said main bit line and said auxiliary bit line are formed on said identical semiconductor substrate in a stacked manner, and
   said main word line and said auxiliary word line are formed on said identical semiconductor substrate in a stacked manner.

8. The semiconductor memory device according to claim 7, wherein said main bit line and said main word line are formed above said auxiliary bit line and said auxiliary word line.

9. The semiconductor memory device according to claim 4, further comprising:
   a first selector transistor connected between said auxiliary bit line and said main bit line, and
   a second selector transistor connected between said auxiliary word line and said main word line.

10. The semiconductor memory device according to claim 9, further comprising a first selection line connected to the gate of said first selector transistor and a second selection line connected to the gate of said second selector transistor.

11. The semiconductor memory device according to claim 4, wherein said second memory is connected to said main bit line and provided every said memory cell array.

12. The semiconductor memory device according to claim 4, further comprising a transistor connected between said second memory and said main bit line.

13. The semiconductor memory device according to claim 12, further comprising a third selection line connected to the gate of the transistor connected between said second memory and said main bit line.

14. The semiconductor memory according to claim 4, further comprising:
   frequency detection means arranged every said memory cell array for detecting a write frequency and a read frequency of the memory cells of said first memory included in each said memory cell array, and
   refresh means performing rewriting with respect to the memory cells of said first memory included in said memory cell array on the basis of that the sum of the write frequency and the read frequency detected by said frequency detecting means has reached a prescribed frequency.

15. The semiconductor memory device according to claim 14, wherein said frequency detection means includes a counter.

16. The semiconductor memory device according to claim 14, wherein said frequency detection means and said first memory are formed on said semiconductor substrate in a stacked manner.

17. The semiconductor memory device according to claim 1, wherein said first memory includes a ferroelectric memory,
   said second memory includes a static memory, and
   said ferroelectric memory is formed above said static memory in a stacked manner.

18. The semiconductor memory device according to claim 1, wherein said first memory includes a magnetic memory,
   said second memory includes a static memory, and
   said magnetic memory is formed above said static memory in a stacked manner.

19. The semiconductor memory device according to claim 1, wherein said first memory includes a phase change memory,
   said second memory includes a static memory, and
   said phase change memory is formed above said static memory in a stacked manner.

20. The semiconductor memory device according to claim 1, wherein said first memory includes an anti-fuse ROM,
   said second memory includes a static memory, and
   said anti-fuse ROM is formed above said static memory in a stacked manner.

21. The semiconductor memory device according to claim 1, wherein said second memory is provided at the rate of one to the plurality of memory cells of said first memory.

22. A semiconductor memory device comprising:
   a nonvolatile first memory including memory cells arranged in the form of a matrix; and
   a volatile second memory, wherein
   said first memory and said second memory are formed on an identical semiconductor substrate in a stacked manner.

* * * * *